(12) United States Patent
Zeng et al.

(10) Patent No.: US 12,069,819 B2
(45) Date of Patent: Aug. 20, 2024

(54) DISPLAY DEVICE

(71) Applicant: Wuhan China Star Optoelectronics Semiconductor Display Technology Co., Ltd., Wuhan (CN)

(72) Inventors: Longhai Zeng, Wuhan (CN); Chengjie Jia, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/613,962

(22) PCT Filed: Sep. 24, 2021

(86) PCT No.: PCT/CN2021/120049
§ 371 (c)(1),
(2) Date: Nov. 24, 2021

(87) PCT Pub. No.: WO2023/024206
PCT Pub. Date: Mar. 2, 2023

(65) Prior Publication Data
US 2024/0032215 A1    Jan. 25, 2024

(30) Foreign Application Priority Data

Aug. 24, 2021   (CN) .......................... 202110974019.6

(51) Int. Cl.
*H05K 5/00*        (2006.01)
*H05K 5/02*        (2006.01)
(52) U.S. Cl.
CPC ................ *H05K 5/0217* (2013.01)

(58) Field of Classification Search
CPC ..................................................... H05K 5/0217
USPC ......................................................... 361/807
See application file for complete search history.

(56) References Cited

U.S. PATENT DOCUMENTS

| | | | |
|---|---|---|---|
| 11,058,018 B1 * | 7/2021 | Yoon | G06F 1/1643 |
| 11,416,036 B2 * | 8/2022 | Yin | G06F 1/1652 |
| 2020/0314225 A1 * | 10/2020 | Ahn | G09F 9/301 |

FOREIGN PATENT DOCUMENTS

| | | |
|---|---|---|
| CN | 102902308 A | 1/2013 |
| CN | 109872639 A | 6/2019 |
| CN | 111862822 A | 10/2020 |
| CN | 111862825 A | 10/2020 |
| CN | 112150930 A | 12/2020 |
| CN | 112429604 A | 3/2021 |
| CN | 212873896 U | 4/2021 |
| KR | 20140101124 A | 8/2014 |

* cited by examiner

*Primary Examiner* — Binh B Tran
(74) *Attorney, Agent, or Firm* — Nathan & Associates; Menachem Nathan

(57) ABSTRACT

A display device is provided. The display device includes a sliding module including a reel; and a display module. The display module is disposed on the sliding module and includes a flexible display panel and a support layer disposed under the flexible display panel, wherein the support layer is patterned to form a plurality of holes, the reel is provided with a plurality of protrusions, and each of the holes is configured to respectively engage to each of the protrusions.

17 Claims, 3 Drawing Sheets

DISPLAY DEVICE

BACKGROUND OF INVENTION

Field of Invention

The present application relates to a field of display technology, and in particular to a display device.

Description of Prior Art

With continuous development of flexible display technology, folding display technology has been well known, but its corresponding natural defects such as creases are still difficult to overcome. In order to explore new flexible display solutions to overcome the original technical defects, development of out expandable display (OED)-reeling screens began to receive enthusiastic attention.

In a process of winding and unwinding the reel, since a winding part of the screen cannot be attached to the reel, but can only slide on the reel, once pre-tightening is not matched or synchronization of mechanism is insufficient, phenomenon such as wrinkling due to insufficient pre-tightening or screen curling due to insufficient tangential synchronization between the screen and the reel is often present, thereby greatly impacting appearance of the screen. Therefore, to ensure flatness and smoothness of the screen, a combination and synchronization between the screen and the reel are very demanding.

Therefore, there is an urgent need to solve the problems of how to improve the combination and synchronization between a screen and a reel and ensuring flatness of the screen.

SUMMARY OF INVENTION

An object of the present application is to provide a display device to solve the technical problems of limited combination and synchronization between a screen and the reel and limited improvement of flatness of the screen in the prior art.

In order to solve the above problems, the present application provides a display device, including: a sliding module including a reel; and a display module disposed on the sliding module and including a flexible display panel and a support layer disposed under the flexible display panel, wherein the support layer is patterned with a plurality of holes, the reel is provided with a plurality of protrusions, and each of the holes is configured to respectively engage to each of the plurality of protrusions.

In some embodiments, a height of the protrusions is less than or equal to a depth of the holes.

In some embodiments, shapes and sizes of the protrusions are same as shapes and sizes of the holes.

In some embodiments, the support layer includes: a first layer including the holes; and a second layer disposed between the first layer and the flexible display panel.

In some embodiments, a depth of the holes is equal to a thickness of the first layer, and a height of the protrusions is equal to the depth of the holes.

In some embodiments, the first layer and the second layer are made of a same material, and the first layer and the second layer are integrated.

In some embodiments, the holes are arranged in an array at equal intervals, and the holes are staggered in a first direction, wherein the first direction is a winding direction of the display module.

In some embodiments, a period width of the holes in the first direction has a relationship as follows:

$Dt=2\pi R/N$; wherein Dt represents the period width, R represents a radius of the reel, N represents a number of the protrusions in a same column in the first direction, and the period width is a sum of a width of one of the holes and a distance between adjacent ones of the holes in the first direction.

In some embodiments, a shape of the holes includes an ellipse, a diamond, or a rectangle.

In some embodiments, the flexible display panel includes a display area, and a portion of the display module slidably received under the sliding module is parallel to the display area.

The present application also provides a display device, including: a sliding module including a reel; and a display module disposed on the sliding module and including a flexible display panel and a support layer disposed under the flexible display panel, wherein the support layer is patterned with a plurality of holes, the reel is provided with a plurality of protrusions, each of the holes is configured to respectively engage to each of the plurality of protrusions, a height of the protrusions is less than or equal to a depth of the holes, and shapes and sizes of the protrusions are same as shapes and sizes of the holes.

In some embodiments, the support layer includes: a first layer including the holes; and a second layer disposed between the first layer and the flexible display panel.

In some embodiments, a depth of the holes is equal to a thickness of the first layer, and a height of the protrusions is equal to the depth of the holes.

In some embodiments, the first layer and the second layer are made of a same material, and the first layer and the second layer are integrated.

In some embodiments, the holes are arranged in an array at equal intervals, and the holes are staggered in a first direction, wherein the first direction is a winding direction of the display module.

In some embodiments, a period width of the holes in the first direction has a relationship as follows:

$Dt=2\pi R/N$; wherein Dt represents the period width, R represents a radius of the reel, N represents a number of the protrusions in a same column in the first direction, and the period width is a sum of a width of one of the holes and a distance between adjacent ones of the holes in the first direction.

In some embodiments, a shape of the holes includes an ellipse, a diamond, or a rectangle.

In some embodiments, the flexible display panel includes a display area, and a portion of the display module slidably received under the sliding module is parallel to the display area.

Beneficial effect of the present application is that a display device of the present application forms a plurality of holes by patterning a support layer, a reel is provided with a plurality of protrusions, and each of the holes is configured to respectively engage to each of the plurality of protrusions, thereby greatly improving combination and synchronization between a display module and the reel, and improving flatness of the display module. Therefore, the display device of the present application can effectively prevent the display module from wrinkling, curling, and misalignment.

In addition, the support layer is used as an under-screen layer, which not only can provide friction that can cooperate with the reel, but also provides certain support performance and anti-tensile performance of the flexible display panel.

BRIEF DESCRIPTION OF DRAWINGS

In order to more clearly illustrate the technical solutions of the embodiments of the application, the drawings illustrating the embodiments will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
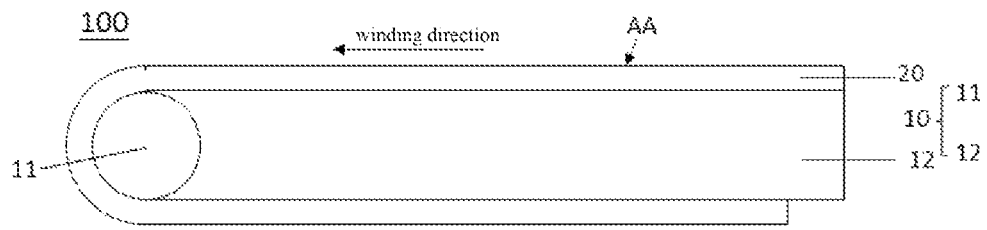
FIG. 1 is a schematic structural diagram of a display device in an embodiment of the present application.
Figure 2:
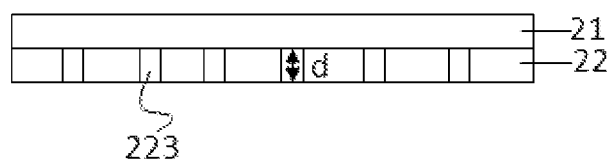
FIG. 2 is a schematic structural diagram of a display module in an embodiment of the present application.
Figure 3:
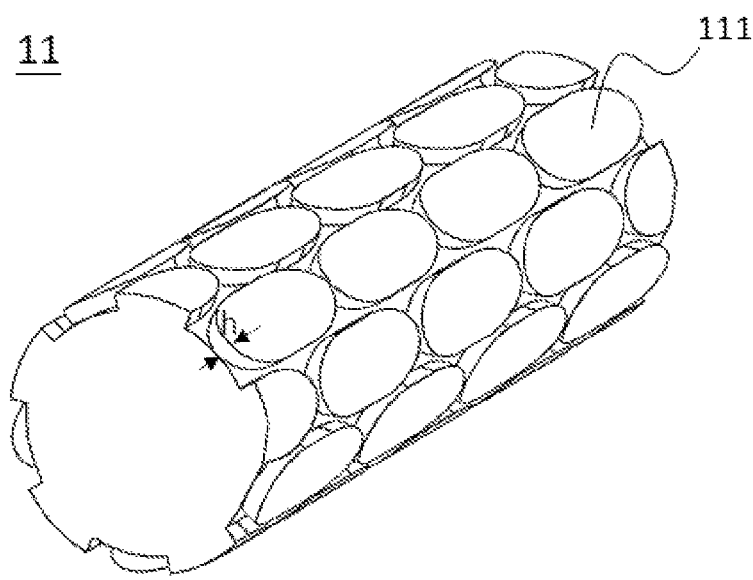
FIG. 3 is a schematic structural diagram of a reel in an embodiment of the present application.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

In the description of this application, it should be understood that the terms "center", "longitudinal", "transverse", "length", "width", "thickness", "upper", "lower", "front", "Rear", "left", "right", "vertical", "horizontal", "top", "bottom", "inside", "outside", "clockwise", "counterclockwise", and the like are based on the orientation or positional relationship shown in the drawings, and is merely for the convenience of describing the present invention and simplifying the description, rather than indicating or implying that the device or element referred to must have a specific orientation, structure and operation in a specific orientation, which should not be construed as limitations on the present invention. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

In the description of the present invention, it should be noted that the terms "installation", "connection", and "bonding" are to be understood broadly unless otherwise explicitly defined and limited. For example, it may be fixed connection, detachable connection, or integrally connection; being mechanical or electrical connection; also, being directly connection, indirectly connection through an intermediate medium, or internal communication of two components. The specific meaning of the above terms in the present invention is appreciated in a specific case by those skilled in the art.

The following disclosure provides many different embodiments or examples for realizing different structures of the present application. To simplify the disclosure of the present application, the components and settings of specific examples are described below. Of course, they are only examples and are not intended to limit the application. In addition, the present application may repeat reference numerals and/or reference letters in different examples. Such repetition is for the purpose of simplification and clarity, and does not indicate the relationship between the various embodiments and/or settings discussed. In addition, this application provides examples of various specific processes and materials, but those of ordinary skill in the art may be aware of the applications of other processes and/or the use of other materials.

Technical solutions of the present application will now be described in conjunction with specific embodiments.

In an out expandable display (OED) screen of the current technology, since a winding part of the screen cannot be attached to the reel, but can only slide on the reel, phenomenon such as wrinkling due insufficient pre-tightening or screen curling due to insufficient tangential synchronization between the screen and the reel is often present, greatly impacting appearance of the screen. Therefore, the present application provides a technical solution for how to improve a combination and synchronization between the screen and the reel, and flatness of the screen.

As shown in FIGS. 1 to 4, the present application provides a display device 100 which includes a sliding module 10 and a display module 20. The sliding module includes a reel 11, and the display module 20 is disposed on the sliding module 10 and includes a flexible display panel 21 and a support layer 22 located under the flexible display panel 21.

The support layer 22 is patterned to form a plurality of holes 223, the reel 11 has a plurality of protrusions 111, and each of the holes 223 is configured to respectively engage to each of the plurality of protrusions 111.

In an embodiment, the holes at an edge of the support layer 22 may not correspond to the protrusions, or two of the protrusions may correspond to one of the holes. It is appreciated that, preferably, the holes 223 and the protrusions 111 engage with each other in a one-to-one correspondence.

It should be noted that the holes 223 may or may not penetrate the support layer 22. In the figures of the present application, the holes 223 are illustrated as penetrating the support layer 22 as an example for description, but the present application is not particularly limited thereto.

In the display device 100 of the present application, a plurality of holes 223 are formed by patterning the support layer 22, the reel 11 is provided with a plurality of protrusions 111, and each of the holes 223 is configured to respectively engage to each of the plurality of protrusions 111, thereby greatly improving the combination and synchronization between the display module 20 and the reel 11, and the flatness of the display module 20. Therefore, the display device 100 of the present application can effectively prevent the display module 20 from wrinkling, curling, and misalignment.

In addition, the support layer 22 serves as an under-screen layer, which not only provides friction that can cooperate with the reel 11, but also provides certain support performance and anti-tensile performance of the flexible display panel 21.

Further, the sliding module 10 further includes a sliding body 12, and the sliding body 12 is used to carry the display module 20.

In an embodiment, the sliding module 10 further includes a sliding block (not shown) that is arranged on the sliding body 12 and slidable relative to the sliding body 12, one end of the display module 20 can be fixed on the sliding block, and the display device 100 drives the reel 11 to rewind or unwind the display module 20 by the relative sliding between the sliding body 12 and the sliding block. It should be noted that the present application is not limited to this type of operation, and may also include any other operations of out expandable display (OED) display screens.

In addition, it is appreciated that the display device 100 shown in FIG. 1 is only a schematic diagram of the display device 100 of the present application, and the reel 11 may not only be arranged on one side of the sliding module 10, but also can be arranged on opposite sides of the sliding module 10. That is, the display device 100 may be in a form of a single-sided sliding roll or may be in a form of a double-sided sliding roll.

Further, the plurality of holes 223 formed by patterning the support layer 22 may be provided on an entire surface, or only formed by patterning a portion of the support layer 22 that needs to be wound by the reel 11. Therefore, such a design of the patterned holes can improve supportability of the support layer 22 and flatness and bending performance of the support layer 22 along its axial direction, thereby preventing wrinkles. In addition, by partition-patterning to form the holes, the bending stiffness and the supporting performance and the tensile performance of the support layer 22 can be further balanced.

The flexible display panel 21 can be any flexible display panel, which is not particularly limited in the present application.

A material of the support layer 22 includes stainless steel (SUS), polyethylene terephthalate (PET), or polyimide (PI).

In an embodiment, as shown in FIG. 1, the flexible display panel 21 includes a display area AA, and a portion of the display module 20 slidably received under the sliding module 10 is parallel to the display area AA. By arranging the display modules 20 above and below the sliding module 10 to be parallel to each other, the display modules 20 also to be parallel to the sliding module 10, it can improve flatness of the display module 20, and its stability when sliding relative to the sliding module 10.

In an embodiment, a height h of the protrusions 111 is equal to the depth of the holes 223.

Since the display module 20 will receive a certain force in a normal direction of the reel 11 when it is winding, if the height h of the protrusions 111 is too large or too small, the screen will be uneven, thereby impacting the display effect, or damaging the screen and resulting in failure of the screen display. Therefore, preferably, by setting the height h of the protrusions 111 to be equal to the depth d of the holes 223, the holes 223 can be filled up, thereby improving the flatness and stability of the screen.

In an embodiment, shapes and sizes of the protrusions 111 and the holes 223 are the same. By setting the shape and size of the protrusions 111 to be the same as those of the holes 223, the screen can effectively engage a rotating shaft, thereby greatly improving the combination and synchronization between the display module 20 and the reel 11, and improving the flatness and stability of the display module 20.

Figure 4:
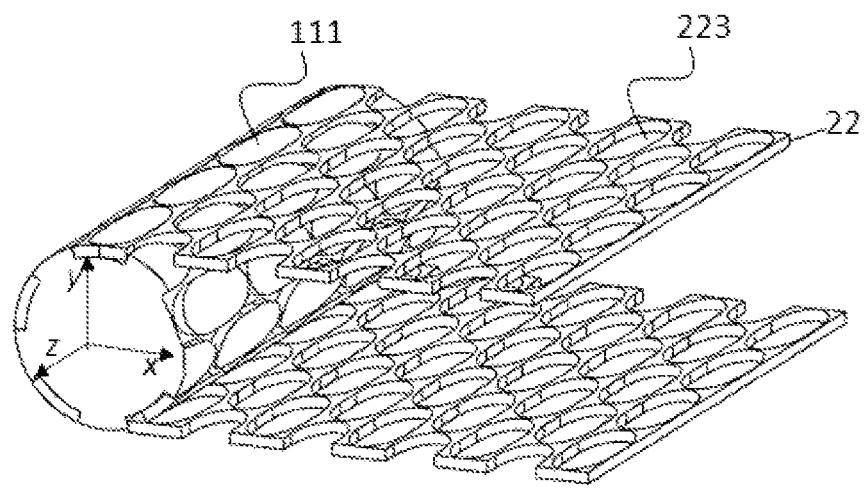
FIG. 4 is a schematic diagram of cooperation between the display module and the reel in an embodiment of the present application.
Figure 5:
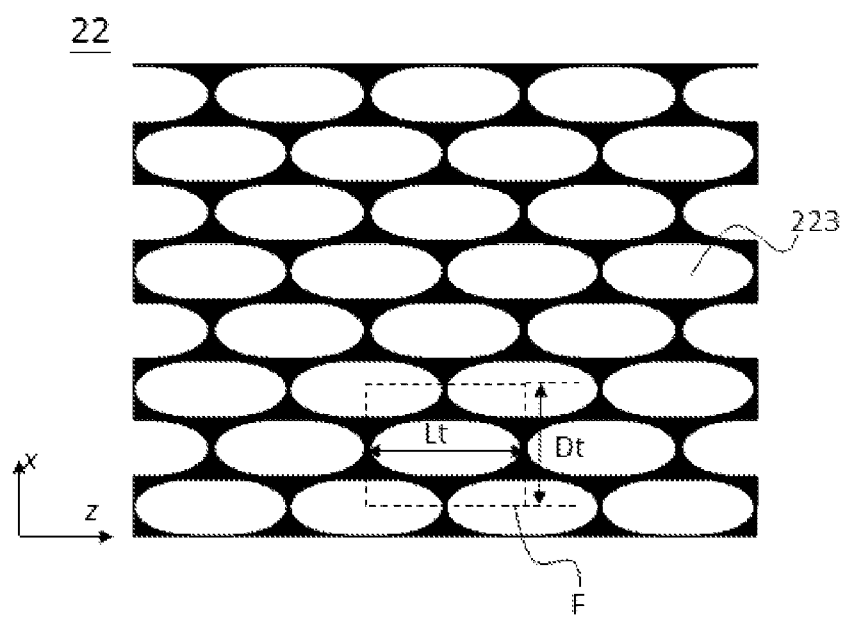
FIG. 5 is a schematic diagram of patterned holes of a support layer in an embodiment of the present application.
Figure 6:
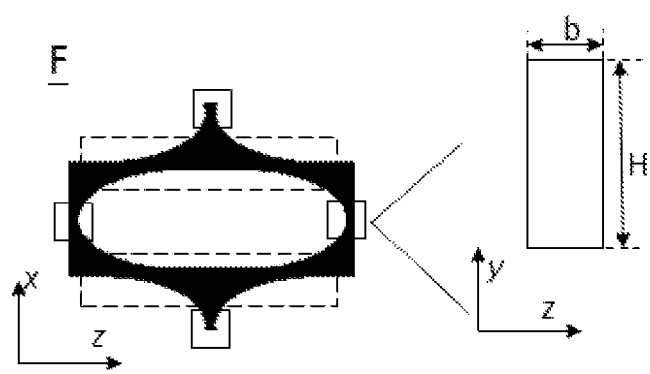
FIG. 6 is a schematic diagram of a unit cell structure of the patterned holes in an embodiment of the present application.

As shown in FIGS. 4 to 6, in an embodiment, the holes 223 are arranged in an array at equal intervals, and the holes 223 are staggered in a first direction X. Specifically, the holes 223 are staggered in the first direction X in a manner that the holes 223 in the next row correspond to a symmetry axes of adjacent ones of the holes 223 in the previous row. In this embodiment, a row direction is a third direction Z.

It is appreciated that the first direction X shown in FIG. 4 is a winding direction or an unwinding direction of the display module 20, the second direction Y is a radial direction of the reel 11 or a depth of the holes 223, the third direction Z is a normal direction of a plane formed by the first direction X and the second direction Y, and the third direction Z is also a row direction patterned holes shown in FIG. 5.

By arranging the holes 223 in adjacent rows in a staggered arrangement in the first direction X, the bending modulus in the first direction X (winding direction) can be made smaller while ensuring a transverse strength at the same time. Therefore, a design of the patterned holes is the present application can make the patterned holes discontinuous in the first direction X, and the staggered holes form a spring-like structure, which greatly reduces the tensile and bending modulus in the winding direction, so that the patterned holes have continuous ribs in the third direction Z (the row direction) (please refer to FIG. 6. FIG. 6 is a schematic diagram of a unit cell structure F. The unit cell structure F can be divided into two beams marked by upper and lower rectangles and ribs marked by four squares), thereby ensuring tensile and bending strength in the row direction (transverse direction).

Further, a period width (Dt) of the holes in the first direction X has a relationship as follows:

$$Dt=2\pi R/N;$$

wherein Dt represents the period width, R represents a radius of the reel 11, N represents a number of the protrusions 111 in a same column in the first direction X, and the period width is a sum of a width of one of the holes 223 and a distance between adjacent ones of the holes 223 in the first direction X. Referring to FIG. 5, a number of the protrusions 111 in a same row in the first direction X is 4, but the present application is not particularly limited thereto, and the number of the protrusions 111 can be designed according to specific conditions.

In the present application, the patterned holes are complied with the above formula, so that the screen can be further effectively engage the rotating shaft, thereby greatly improving the combination and synchronization between the display module 20 and the reel 11, and improving the flatness and stability of the display module 20.

As shown in FIG. 5, a smallest repeating unit of the patterned holes is the unit cell structure F shown in FIG. 5, and the unit cell structure F has a period width Dt and a period length Lt.

The period length Lt=f(Et), where Et is an anti-bending stiffness of a rib; that is, the period length Lt is a function of the anti-bending stiffness Et of the rib. The anti-bending stiffness of the rib is $Et=Es*I_h$, where Es is a tensile modulus of a beam, and Ih is a moment of inertia of the rib in the second direction Y (thickness direction).

FIG. 6 is a schematic diagram of the unit cell structure F. The unit cell structure F can be divided into two beams marked by upper and lower rectangles and ribs marked by four squares. When considering the design of the patterned holes, structural deformation of the patterned holes can be divided into the following two situations: the first situation is that the patterned holes deform when they receive a tensile force in the first direction X, and such deformation can be simply defined as vertical stretching of a rib and bending of a beam; and the second situation is that when the patterned holes are curled in the third direction Z, such deformation can be simply defined as bending of the rib around a Z axis and twisting of a beam by at opposite ends of the rib.

Specifically, since the present application mainly focuses on the corresponding relationship between the holes 223 and the protrusions 111, the second situation described above is mainly considered. The right figure of FIG. 6 is a schematic cross-sectional view of the rib at a YZ coordinate. When considering the anti-bending stiffness Et of the rib, except for the tensile modulus Es of the beam, its Ih is related to a cross-sectional shape of the beam. When the cross-sectional shape of the beam remains unchanged, the moment of inertia of the rib in the second direction Y (thickness direction) is complied with $I_h=b*H^3/12$; where b is a width of the rib in the third direction Z, and H is a thickness of the rib in the second direction Y. When the holes 223 penetrate the support layer 22, H is equal to the depth d of the holes. Therefore, the period length Lt may be determined according to the width b of the rib in the third direction Z and the thickness H of the rib in the second direction Y. That is, the period length Lt is related to the depth d of the holes and a distance between adjacent ones of the holes in the third direction Z.

In the present application, by designing the patterned holes with the above-mentioned relationship, the bending stiffness can be much smaller than that of the screen to prevent the bending performance of the screen from being affected, so that the screen and the reel can be further effectively engaged, thereby greatly improving the combination and synchronization between the display module 20 and the reel 11, and improving the flatness and stability of the display module 20.

It is appreciated that the patterned holes shown in FIG. 5 are only an example of the present application, and a shape of each of the patterned holes in the present application may include other shapes such as an ellipse, a diamond, or a rectangle, as long as its design conforms to the above relationship.

Figure 7:
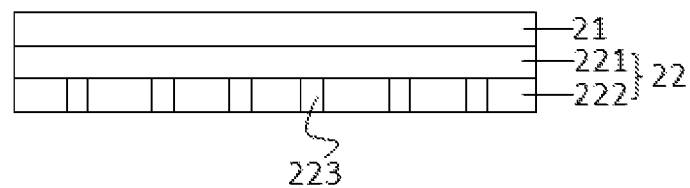
FIG. 7 is a schematic structural diagram of another display module in an embodiment of the present application.

As shown in FIG. 7, FIG. 7 is a schematic structural diagram of another display module 20 in an embodiment of the present application.

The display device of this embodiment is similar to the above-mentioned display device, except that the support layer 22 includes a first layer 222 and a second layer 221. The first layer 222 includes the holes 223, and the second layer 221 is disposed between the first layer 222 and the flexible display panel 21.

Further, the depth d of the holes 223 is equal to a thickness of the first layer 222, and the height h of the protrusions 111 is equal to the depth d of the holes 223.

In this embodiment, by setting the height h of the protrusions 111 to be equal to the depth d of the holes 223, the holes 223 can be filled up, thereby improving the flatness and stability of the screen.

In an embodiment, materials of the first layer 222 and the second layer 221 are the same, and the first layer 222 and the second layer 221 are integrated.

In another embodiment, the materials of the first layer 222 and the second layer 221 are different, that is, the first layer 222 and the second layer 221 are composite layers.

It is appreciated that the first layer 222 has functions of further providing support performance and anti-tensile performance because of its blanket film structure, and the second layer 221 can engage the reel 11. Therefore, in this embodiment, by making the support layer 22 include the first layer 222 and the second layer 221, the combination and synchronization between the display module 20 and the reel 11, as well as the support performance and tensile performance of the display module 20 are greatly improved.

When the support layer 22 includes the first layer 222 and the second layer 221, when considering the anti-bending stiffness Et of the ribs, a neutral layer offset caused by the composite layers also needs to be considered.

Specifically, as shown in FIG. 6, the right figure of FIG. 6 is a schematic cross-sectional view of the rib at a YZ coordinate. When considering the anti-bending stiffness Et of the rib, except for the tensile modulus Es of the beam, its Ih is related to a cross-sectional shape of the beam. When the cross-sectional shape of the beam remains unchanged and the neutral layer offset caused by the composite layers is considered, the moment of inertia of the rib in the second direction Y (thickness direction) is complied with $I_h=b*H^3/12+a^2 A$; where b is a width of the rib in the third direction Z, H is a thickness of the rib in the second direction Y, A is a cross-sectional area of the rib, and a is an offset distance of a bending axis relative to a symmetry axis of the rib. When the holes 223 penetrate the second layer 221, H is equal to the depth d of the holes. Therefore, the period length Lt needs to be determined according to the cross-sectional area A of the rib and the offset distance a between the bending axis and the symmetry axis of the rib.

In the present application, by designing the patterned holes with the above-mentioned relationship, the bending stiffness can be much smaller than that of the screen to prevent the bending performance of the screen from being affected, so that the screen and the reel can be further effectively engaged, thereby greatly improving the combination and synchronization between the display module 20 and the reel 11, and improving the flatness and stability of the display module 20.

In the display device 100 of the present application, the plurality of holes 223 are formed by patterning the support layer 22, and the reel 11 is provided with the plurality of protrusions 111, and the holes 223 correspondingly engage the protrusions 111 in a one-to-one correspondence, thereby greatly improving the combination and synchronization between the display module 20 and the reel 11, and the flatness of the display module 20. Therefore, the display device 100 of the present application can effectively prevent the display module 20 from wrinkling, curling, and misalignment.

In the above-mentioned embodiments, the description of each embodiment has its own emphasis, and parts that are not described in detail in an embodiment may be referred to related descriptions of other embodiments.

The embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A display device, comprising:
   a sliding module comprising a reel; and a display module disposed on the sliding module, wherein the display module comprises a flexible display panel and a support layer is disposed under the flexible display panel, wherein the support layer is patterned with a plurality of holes, the reel is provided with a plurality of protrusions, and each of the holes is configured to respectively engage to each of the plurality of the protrusions, and wherein the support layer comprises:
 a first layer comprising the holes; and
 a second layer disposed between the first layer and the flexible display panel.

2. The display device according to claim 1, wherein a height of the protrusions is less than or equal to a depth of the holes.

3. The display device according to claim 1, wherein shapes and sizes of the protrusions are same as shapes and sizes of the holes.

4. The display device according to claim 1, wherein a depth of the holes is equal to a thickness of the first layer, and a height of the protrusions is equal to the depth of the holes.

5. The display device according to claim 4, wherein the first layer and the second layer are made of a same material, and the first layer and the second layer are integrated.

6. The display device according to claim 1, wherein the holes are arranged in an array at equal intervals, and the holes are staggered in a first direction, wherein the first direction is a winding direction of the display module.

7. The display device according to claim 6, wherein a period width of the holes in the first direction has a relationship as follows:

$$Dt=2\pi R/N;$$

wherein Dt represents the period width, R represents a radius of the reel, N represents a number of the protrusions in a same column in the first direction, and the period width is a sum of a width of one of the holes and a distance between two adjacent ones of the holes in the first direction.

8. The display device according to claim 1, wherein a shape of the holes comprises an ellipse, a diamond or a rectangle.

9. The display device according to claim 1, wherein the flexible display panel comprises a display area, and a portion of the display module slidably received under the sliding module is parallel to the display area.

10. A display device, comprising:
 a sliding module comprising a reel; and
 a display module disposed on the sliding module and comprising a flexible display panel and a support layer disposed under the flexible display panel,
 wherein the support layer is patterned with a plurality of holes, the reel is provided with a plurality of protrusions, each of the holes is configured to respectively engage to each of the plurality of protrusions, a height of the protrusions is less than or equal to a depth of the holes, and shapes and sizes of the protrusions are same as shapes and sizes of the holes, and wherein the support layer comprises:
 a first layer comprising the holes; and
 a second layer disposed between the first layer and the flexible display panel.

11. The display device according to claim 10, wherein a depth of the holes is equal to a thickness of the first layer, and a height of the protrusions is equal to the depth of the holes.

12. The display device according to claim 11, wherein the first layer and the second layer are made of a same material, and the first layer and the second layer are integrated.

13. The display device according to claim 10, wherein the holes are arranged in an array at equal intervals, and the holes are staggered in a first direction, wherein the first direction is a winding direction of the display module.

14. The display device according to claim 13, wherein a period width of the holes in the first direction has a relationship as follows:

$$Dt=2\pi R/N;$$

wherein Dt represents the period width, R represents a radius of the reel, N represents a number of the protrusions in a same column in the first direction, and the period width is a sum of a width of one of the holes and a distance between adjacent ones of the holes in the first direction.

15. The display device according to claim 10, wherein a shape of the holes comprises an ellipse, a diamond, or a rectangle.

16. The display device according to claim 10, wherein the flexible display panel comprises a display area, and a portion of the display module slidably received under the sliding module is parallel to the display area.

17. A display device, comprising:
 a sliding module comprising a reel; and
 a display module disposed on the sliding module, wherein the display module comprises a flexible display panel and a support layer is disposed under the flexible display panel,
 wherein the support layer is patterned with a plurality of holes, the reel is provided with a plurality of protrusions, and each of the holes is configured to respectively engage to each of the plurality of the protrusions,
 wherein the holes are arranged in an array at equal intervals, and the holes are staggered in a first direction, wherein the first direction is a winding direction of the display module,
 wherein a period width of the holes in the first direction has a relationship as follows:

$$Dt=2\pi R/N;$$

wherein Dt represents the period width, R represents a radius of the reel, N represents a number of the protrusions in a same column in the first direction, and the period width is a sum of a width of one of the holes and a distance between two adjacent ones of the holes in the first direction.

* * * * *